United States Patent
Voss et al.

(10) Patent No.: US 9,111,989 B2
(45) Date of Patent: Aug. 18, 2015

(54) INSULATED GATE BIPOLAR TRANSISTOR INCLUDING EMITTER SHORT REGIONS

(71) Applicant: Infineon Technologies Austria AG, Villach (AT)

(72) Inventors: Stephan Voss, Munich (DE); Erich Griebl, Dorfen (DE); Alexander Breymesser, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/850,798

(22) Filed: Mar. 26, 2013

(65) Prior Publication Data

US 2014/0291724 A1 Oct. 2, 2014

(51) Int. Cl.
*H01L 29/739* (2006.01)
*H01L 29/06* (2006.01)
*H01L 29/74* (2006.01)
*H01L 29/08* (2006.01)
H01L 29/10 (2006.01)
H01L 29/70 (2006.01)

(52) U.S. Cl.
CPC ........ *H01L 29/7397* (2013.01); *H01L 29/0611* (2013.01); *H01L 29/0696* (2013.01); *H01L 29/0834* (2013.01); *H01L 29/7416* (2013.01); H01L 29/1095 (2013.01); H01L 29/70 (2013.01); H01L 2924/13028 (2013.01)

(58) Field of Classification Search
CPC ............ H01L 29/0834; H01L 29/7395; H01L 29/0696; H01L 29/1095; H01L 29/8611; H01L 29/66136; H01L 29/7393; H01L 29/7804; H01L 29/66325
See application file for complete search history.

(56) References Cited

U.S. PATENT DOCUMENTS

| 2004/0144992 A1 | 7/2004 | Willmeroth et al. | |
| 2010/0156506 A1* | 6/2010 | Tsuzuki et al. | 327/478 |
| 2012/0132954 A1* | 5/2012 | Kouno et al. | 257/140 |
| 2012/0181575 A1* | 7/2012 | Pfirsch | 257/139 |

* cited by examiner

*Primary Examiner* — Colleen A Matthews
*Assistant Examiner* — Junaiden Mirsalahuddin
(74) *Attorney, Agent, or Firm* — Murphy, Bilak & Homiller, PLLC

(57) ABSTRACT

A semiconductor device includes an IGBT having a semiconductor body including a transistor cell array in a first area. A junction termination structure is in a second area surrounding the transistor cell array at a first side of the semiconductor body. An emitter region of a first conductivity type is at a second side of the semiconductor body opposite the first side. The device further includes a diode. One of the diode anode and cathode includes the body region. The other one of the anode and the cathode includes a plurality of distinct first emitter short regions of a second conductivity type at the second side facing the transistor cell array, and at least one second emitter short region of the second conductivity type at the second side facing the junction termination structure. The at least one second emitter short region is distinct from the first emitter short regions.

20 Claims, 6 Drawing Sheets

INSULATED GATE BIPOLAR TRANSISTOR INCLUDING EMITTER SHORT REGIONS

BACKGROUND

Reverse conducting insulated gate bipolar transistors (RC-IGBTs) function as IGBTs with a monolithic integrated antiparallel diode. In case of n-channel RC-IGBTs, a p-doped emitter at a rear side electrically coupled to a collector terminal is interrupted by highly n-doped regions acting as emitter shorts between a drift zone and an electrode at the rear side.

In a power semiconductor transistor such as an RC-IGBT an active area including transistor cells connected in parallel is surrounded by a junction termination structure. In a blocking mode of the IGBT the junction termination structure reduces an electric field in a lateral direction from the transistor cell array to a chip edge.

One goal of development of new generations of RC-IGBTs lies in a shrink of an active chip area while maintaining or improving chip functionality. A shrink of active chip area is accompanied by a shrink of a total area of the monolithic integrated antiparallel diode leading to an increase of a forward bias voltage at a reference current. A similar impact may be caused by a reduction of a thermal budget after processing a rear side emitter and the emitter shorts. The functionality of the monolithic integrated antiparallel diode may also be affected by a voltage applied to a gate electrode of the RC-IGBT in a forward bias mode of the monolithic integrated antiparallel diode. Depending on an implementation of an RC-IGBT, a gate voltage of an n-channel RC-IGBT may be positive in a forward bias mode of the monolithic integrated antiparallel diode. In this case, a field effect transistor (FET) channel may be turned on leading to a discharge of electrons injected by the emitter shorts acting as a cathode of the monolithic integrated antiparallel diode. Discharge of these electrons via the channel suppresses bipolar gain by a p-doped body region acting as an anode of the monolithic integrated antiparallel diode. Again, an increase of a forward bias voltage at a reference current may result leading to an increase of conduction losses of the antiparallel diode.

There is a need for a RC-IGBT, which, among other advantages and features, exhibits an improved trade-off between conducting and switching losses.

SUMMARY

In accordance with an embodiment, a semiconductor comprises an IGBT. The

IGBT includes a semiconductor body including a transistor cell array in a first area. IGBT further includes a junction termination structure in a second area surrounding the transistor cell array at a first side of the semiconductor body. The IGBT further includes an emitter region of a first conductivity type at a second side of the semiconductor body opposite the first side. The semiconductor device further includes a diode comprising an anode and a cathode. Wherein one of: the anode includes the body region and the cathode includes a plurality of distinct first emitter short regions of a second conductivity type at the second side facing the transistor cell array and at least one second emitter short region of the second conductivity type at the second side facing the junction termination structure; or the cathode includes the body region and the anode includes the distinct first emitter short regions and the at least one second emitter short region. The at least one second emitter short region is distinct from the first emitter short regions. A first ratio between an area of the plurality of distinct first emitter short regions and the first area is smaller than a second ratio of the at least one second emitter short region and the second area.

Those skilled in the art will recognize additional features and advantages upon reading the following detailed description and on viewing the accompanying drawings

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

Figure 1A:
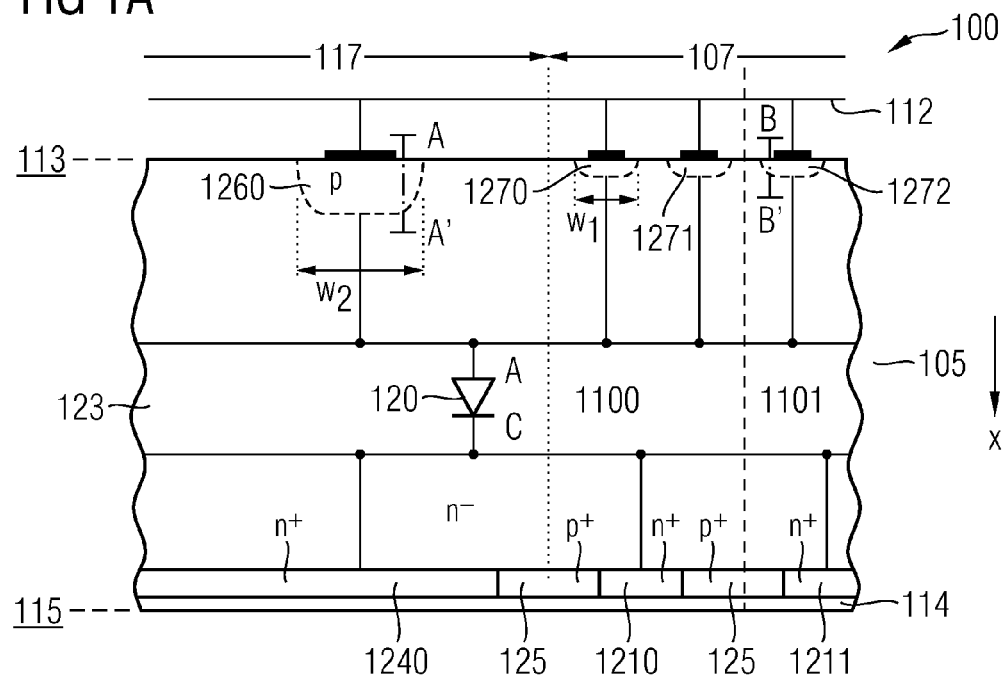
FIG. 1A is a schematic cross-sectional view of a portion of a RC-IGBT in accordance with an embodiment.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described as part of one embodiment can be used in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes are designated by the same references in the different drawings if not stated otherwise.

As employed in the specification, the term "electrically coupled" is not meant to mean that the elements must be directly coupled together. Instead, intervening elements may be provided between the "electrically coupled" elements. As an example, none, part, or all of the intervening element(s) may be controllable to provide a low-ohmic connection and, at another time, a non-low-ohmic connection between the "electrically coupled" elements. The term "electrically connected" intends to describe a low-ohmic electric connection between the elements electrically connected together, e.g., a connection via a metal and/or highly doped semiconductor.

Some Figures refer to relative doping concentrations by indicating "−" or "+" next to the doping type. For example, "n−" means a doping concentration which is less than the doping concentration of an "n"-doping region while an "n+"-doping region has a larger doping concentration than the "n"-doping region. Doping regions of the same relative doping concentration may or may not have the same absolute doping concentration. For example, two different n$^+$-doped regions can have different absolute doping concentrations. The same applies, for example, to an n$^-$-doped and a p$^+$-doped region. In the embodiments described below, a conductivity type of the illustrated semiconductor regions is denoted n-type or p-type, in more detail one of n$^-$-type, n-type, n$^+$-type, p$^-$-type, p-type and p$^+$-type. In each of the illustrated embodiments, the conductivity type of the illustrated semiconductor regions may be vice versa. In other words, in an alternative embodiment to any one of the embodiments described below, an illustrated p-type region may be n-type and an illustrated n-type region may be p-type.

Terms such as "first", "second", and the like, are used to describe various structures, elements, regions, sections, etc. and are not intended to be limiting. Like terms refer to like elements throughout the description.

The terms "having", "containing", "including", "comprising" and the like are open and the terms indicate the presence of stated elements or features, but not preclude additional elements or features. The articles "a", "an" and "the" are intended to include the plural as well as the singular, unless the context clearly indicates otherwise.

FIG. 1A illustrates a schematic cross-sectional view through a portion of a semiconductor body 105 of an RC-IGBT 100. The semiconductor body 105 includes a semiconductor substrate such as a monocrystalline semiconductor substrate. According to an embodiment, the semiconductor substrate is one of silicon (Si), germanium (Ge) or a silicon-germanium compound (SiGe). According to other embodiments, the monocrystalline semiconductor substrate may be gallium nitride GaN, gallium arsenide GaAs, gallium aluminum arsenide (GaAlAs) or silicon carbide (SiC), for example. On the semiconductor substrate, one or more optional semiconductor layer(s) may be arranged, e.g. by epitaxial semiconductor layer(s), for example.

The RC-IGBT 100 includes a transistor cell array in a first area 107, e.g. a transistor cell array area. The transistor cell array includes a plurality of transistor cells, e.g. transistor cells 1100, 1101 connected in parallel between a first contact 112 at a first side 113, e.g. a front side contact at an emitter terminal of the RC-IGBT 100, and a second contact 114 at a second side 115 opposite to the first side 113, e.g. a rear side emitter contact at a collector terminal of the RC-IGBT 100.

Figure 1B:
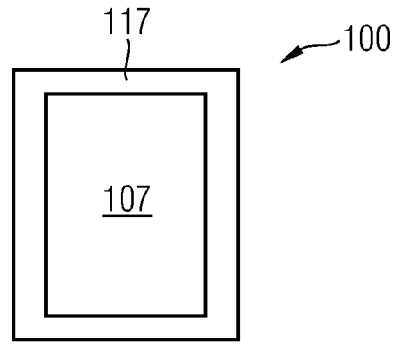
FIG. 1B is a schematic top view of the RC-IGBT illustrated in FIG. 1A.

The RC-IGBT 100 further includes a junction termination structure in a second area 117, e.g. junction termination structure area. The junction termination structure area in the second area 117 surrounds the transistor cell array in the first area 107 at the first side 113 (c.f. top view of RC-IGBT 100 illustrated in FIG. 1B).

An antiparallel diode 120 and the RC-IGBT 100 are monolithically integrated and share semiconductor regions in the semiconductor body 105.

In the schematic cross-sectional view of FIG. 1A, selected semiconductor regions are illustrated for the purpose of a further understanding of the embodiment. The antiparallel diode 120 includes distinct n$^+$-doped first emitter short regions 1210, 1211 electrically connecting an n$^-$-doped drift region 123 and the second contact 114. The n$^+$-doped first emitter short regions 1210, 1211 laterally adjoin a p$^+$-doped rear side emitter region 125 and are arranged at the second side 115 in the first area 107.

The antiparallel diode 120 further includes an n$^+$-doped second emitter short region 1240 electrically connecting the n$^-$-doped drift region 123 and the second contact 114. The n$^+$-doped second emitter short region 1240 laterally adjoins the V-doped doped rear side emitter region 125 and is arranged at the second side 115 in the second area 117 facing the junction termination structure.

The n$^+$-doped first and second emitter short regions 1210, 1211, 1240 are part of a cathode C of the antiparallel diode 120.

The junction termination structure includes a p-doped junction termination region 1260 electrically connected to p-doped body regions 1270, 1271, 1272 of the RC-IGBT 100 in the transistor cell array by the first contact 112. The first contact 112 may include one or a plurality of conductive materials, e.g. metal(s), metal compounds(s), doped semiconductor material(s), silicide(s) and any combination thereof. The first contact 112 may include any kind of contact openings in a dielectric layer filled with conductive material (s), e.g. contact plug(s) and contact line(s) and wiring layer(s) interconnecting elements in different areas of the semiconductor body 105. According to an embodiment, a width $w_2$ of the p-doped junction termination region 1260 ranges between 5 μm and 120 μm or between 30 μm to 80 μm. The width $w_2$ may be adjusted in consideration of a current carrying capacity of contact holes electrically connected to the p-doped junction termination region 1260 and/or current carrying requirements of the p-doped junction termination region 1260 in a conduction mode of the antiparallel diode 120.

In the transistor cell array in the first area 107 further known elements of an IGBT, e.g. a source region, a gate dielectric, a gate electrode and an optional body contact region are integrated without specific illustration in FIG. 1A in order to focus illustration on the antiparallel diode 120. According to one example, the RC-IGBT 100 includes a planar gate structure for controlling the conductivity along a lateral channel region. According to another example, the RC-IGBT 100 includes a trench gate structure for controlling the conductivity along a vertical channel region at a trench sidewall.

The rear side emitter region 125 and the first and second emitter short regions 1210, 1211, 1240 lie in a plane parallel to the second side 115. Moreover, the rear side emitter region 125 and the first and second emitter short regions 1210, 1211, 1240 are electrically connected to the second contact 114 by a common electrode.

A first ratio between an area of the plurality of distinct n$^+$-doped first emitter short regions such as n$^+$-doped first emitter short regions 1210, 1211 and the first area 107 is smaller than a second ratio of all second emitter short region (s) such as the second emitter short region 1240 and the second area 117. The area of the plurality of distinct n$^+$-doped first emitter short regions is determined by summing up all areas of first emitter short regions in a plane parallel to the second side 115. The area of all second emitter short region(s) is likewise determined.

According to an embodiment, the plurality of distinct first emitter short regions and the second emitter short region(s) differ by at least one of lateral dimensions and interval of periodic arrangement. In case the first and second emitter short regions are periodically arranged, e.g. as a two-dimensional pattern, the periodic arrangement of the first and second emitter short regions differ by an interval in at least one direction of period arrangement. The plurality of distinct first emitter short regions may also be scattered over the first area. In other words, the plurality of distinct first emitter short regions may be arranged at irregular intervals, e.g. in a random pattern.

According to an embodiment, a shape of the second emitter short region 1240 is a closed or discontinuous loop surrounding the transistor cell array in the first area 107. The RC-IGBT 100 may also include a plurality of second emitter short regions shaped as closed and/or discontinuous loops surrounding the transistor cell array. The second emitter short region 1240 may also overlap with the first area 107.

According to an embodiment, the first ratio ranges between 1% and 80% of the second ratio, or between 1% and 40% of the second ratio, or even between 1% and 10% of the second ratio. When lowering the upper limit of the above ranges, the conduction losses of the antiparallel diode 120 can be reduced. The first ratio may range between 0.01 and 0.2. The second ratio may range between 0.02 and 1, or between 0.5 and 1, or even between 0.8 and 1. When increasing the lower limit of the above ranges, conduction losses of the diode 120 can be reduced due to larger area of the second shorts and due to a larger contact area for contacts of the second shorts. Second shorts directly facing the p-doped junction termination region 1260 along a vertical direction are beneficial with respect to effectively reducing conduction losses of the diode 120.

Figure 1C:
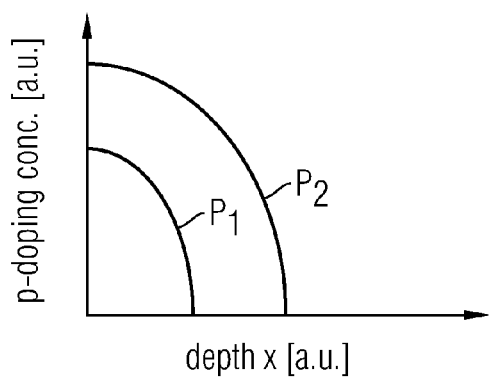
FIG. 1C is a schematic view of vertical p-doping at different locations of the RC-IGBT illustrated in FIG. 1A.

In the embodiment illustrated in FIG. 1A, the p-doped junction termination region 1260 extends deeper into the semiconductor body than each of the body regions 1270, 1271, 1272. As is illustrated in FIG. 1C, the p-doped junction termination region 1260 includes a dosage of p-doping $p_2$ higher than a dosage of p-doping $p_1$ of each of the body regions 1270, 1271, 1272. The dosage of doping of each of the body regions 1270, 1271, 1272 along a depth x is determined by an area between curve $p_1$ and an x-coordinate (c.f. line B-B' of FIG. 1A). The dosage of doping of the p-doped junction termination region 1260 along the depth x is determined by an area between curve $p_2$ and the x-coordinate (c.f. line A-A' of FIG. 1A).

Referring to the schematic cross-sectional view of FIG. 1A again, a width $w_2$ of the p-doped junction termination region 1260 region is greater than a width $w_1$ of each of the body regions 1270, 1271, 1272. Increasing the dosage of doping and the width $w_2$ of the p-doped junction termination region 1260 may allow for an increase in the current capability of the junction termination structure in a forward bias mode of the antiparallel diode 120. According to other embodiments, a vertical doping profile of the p-doped junction termination region 1260 and each of the body regions 1270, 1271, 1272 are equal, i.e. curve $p_1$ applies for the p-doped junction termination region 1260 each of the body regions 1270, 1271, 1272. In this case increasing the width $w_2$ of the p-doped junction termination region 1260 may allow for an increase in the current capability of the junction termination structure in a forward bias mode of the antiparallel diode 120. According to an embodiment, the width $w_2$ of the p-doped junction termination region 1260 ranges between 5 μm and 120 μm, or between 30 μm to 80 μm. The width $w_2$ may be adjusted in consideration of a current carrying capacity of contact holes electrically connected to the p-doped junction termination region 1260 and/or current carrying requirements of the p-doped junction termination region 1260 in a conduction mode of the antiparallel diode 120.

The layout measures described above strengthen the reverse conducting characteristics of an RC-IGBT by effectively utilizing the junction termination area as a part of the antiparallel diode 120, thereby counteracting an increase of a forward bias voltage when shrinking chip dimensions.

Figure 2:
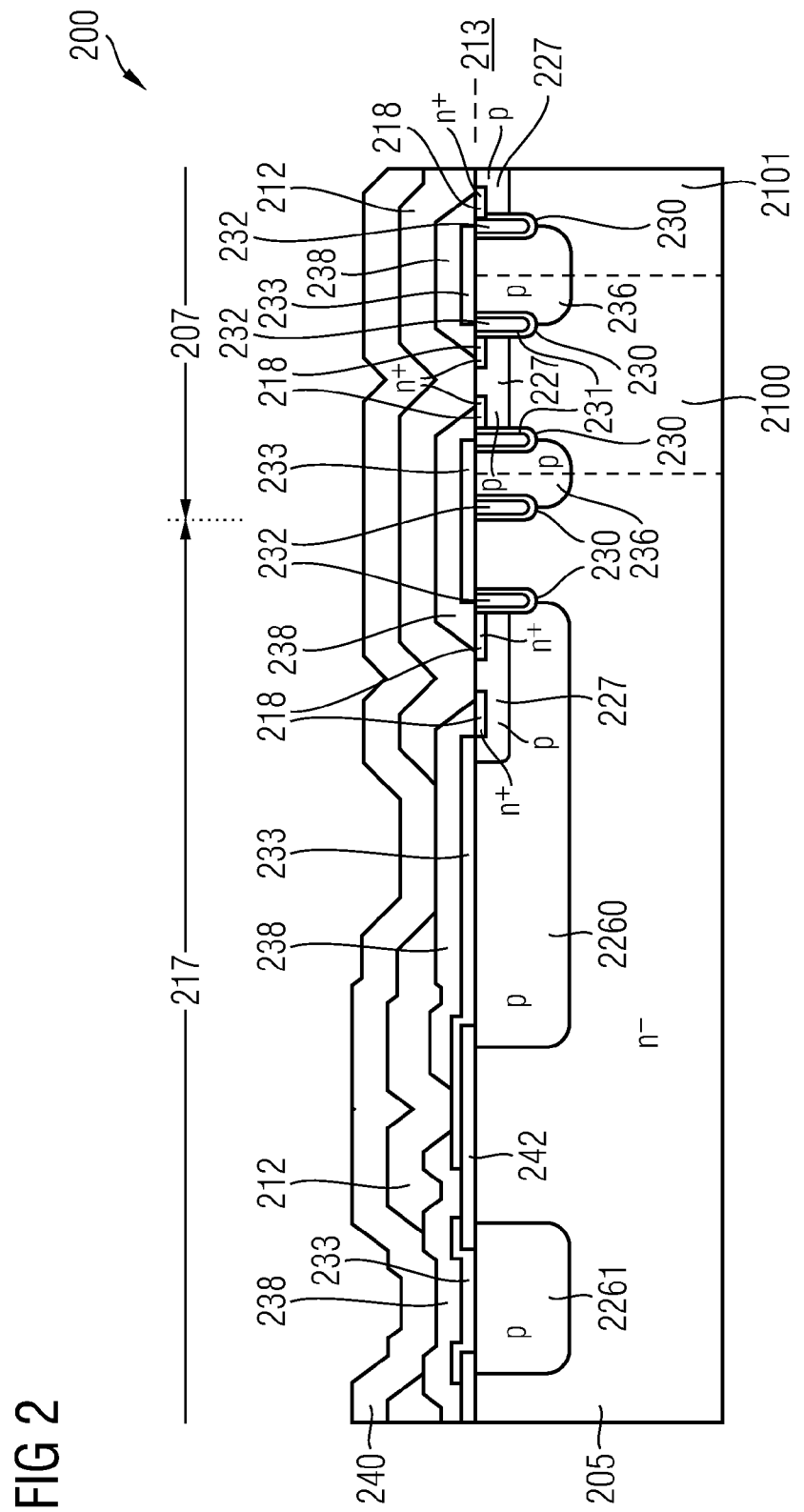
FIG. 2 is a schematic cross-sectional view of a portion of an embodiment of a RC-IGBT in a transition region between a junction termination structure and a transistor cell array.

FIG. 2 illustrates an embodiment of a schematic cross-sectional view through a portion of a semiconductor body 205 of an RC-IGBT 200 in a transition region between a transistor cell array in a first area 207 and a junction termination structure in a second area 217. Gate trenches 230 each include a gate dielectric 231, e.g. a thermal oxide such as $SiO_2$ and a gate electrode 232 including conductive material(s) 233, e.g. metal(s) and/or doped semiconductor material such as doped polysilicon. The conductive material 233 of the gate electrode 232 covers parts of the semiconductor body 205 at a first side 213, e.g. for the purpose of gate electrode interconnection. A floating p-doped region 236 is arranged between opposing gate trenches 230. In the each of transistor cells 2100, 2101 a p-doped body region 227 and an $n^+$-doped source region 218 are electrically coupled to a first contact 212. The first contact 212 extends through an insulating layer 238 to the first side 213 and also extends in a plane parallel to the first side 213. Thus, the first contact 212 acts as a wiring layer and contact opening. A seal layer 240, e.g. an imide covers the covers the first contact 212 and the insulating layer 238.

The junction termination structure in the second area 217 includes p-doped junction termination regions 2260, 2261. An insulating layer 242, e.g. an oxide and/or nitride covers the first side 213 between the p-doped junction termination regions 2260, 2261. The p-doped junction termination region 2261 may be electrically floating. In addition to p-doped junction termination regions 2260, 2261, additional p-doped junction termination regions may be arranged to an outside of the chip depending on voltage blocking requirements of the chip, for example. In addition or as an alternative to floating p-doped region 2261, field plate(s) or Junction Termination Extension structure(s) may be used. The p-doped junction termination region 2260 is electrically coupled to the first contact 212 via the conductive material 233 of the gate electrode 232 covering part of the semiconductor body 205 at the first side 213 in the second area 217. The p-doped junction termination region 2260 adjoins an outermost of the gate trenches 230. The body and source regions 227, 218 are arranged in the p-doped junction termination region 2260. Thus, the conductivity of an outermost channel between the p-doped junction termination region 2260 and an outermost of the gate trenches 230 can be controlled by a voltage applied to the gate electrode 232. Due to the higher doping of the p-doped junction termination region 2260 as compared to the body region 227, a threshold voltage of the outermost transistor channel at a transition between the junction termination structure and the transistor cell array is greater than a threshold voltage of a channel region in the transistor cell array. Even when a typical positive voltage is applied to the gate electrode 232 in turn-on mode, e.g. 15 V, an electron current in the outermost channel is small or negligible with respect to a channel current in the transistor cell array. Thus a diode function of the p-doped junction termination region 2260 in a reverse conducting mode of the RC-IGBT 200 at typical gate voltages is nearly independent of the gate voltage, leading to a reduction of conduction losses of the antiparallel diode in forward bias when the RC-IGBT is not completely turned off.

Details given with respect to elements of the RC-IGBT 100 also apply to the RC-IGBT 200. As an example, layout measures of rear side emitter and emitter shorts in the junction termination area and the transistor cell array of RC-IGBT 100 also apply to the RC-IGBT 200.

FIGS. 3A to 3D illustrate top views of different layouts of second emitter short regions 3240, 3241 facing the junction termination area of the RC-IGBT illustrated in FIG. 1A or FIG. 2.

Figure 3A:
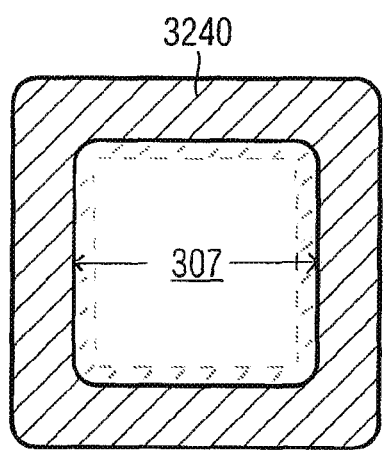
FIGS. 3A to 3D illustrate top views of different layouts of second emitter short regions facing a junction termination area of the RC-IGBT illustrated in FIG. 1A or FIG. 2.

Referring to the top view of FIG. 3A, the second emitter short region 3240 forms one closed contiguous loop.

Figure 3C:
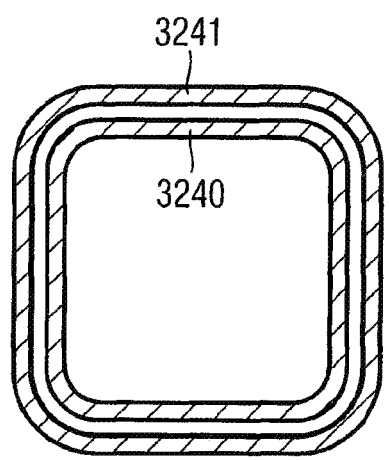
Figure 3B:
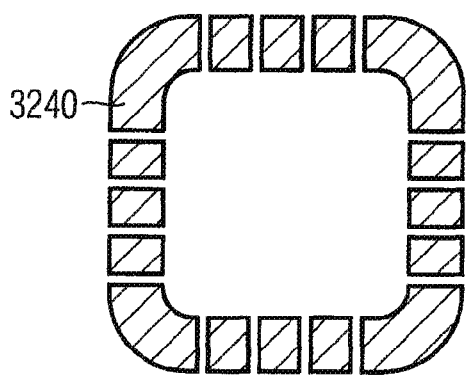

Referring to the top view of FIG. 3B, the second emitter short region 3240 forms one discontinuous loop.

Referring to the top view of FIG. 3C, the second emitter short regions 3240, 3241 form closed contiguous loops.

Figure 3D:
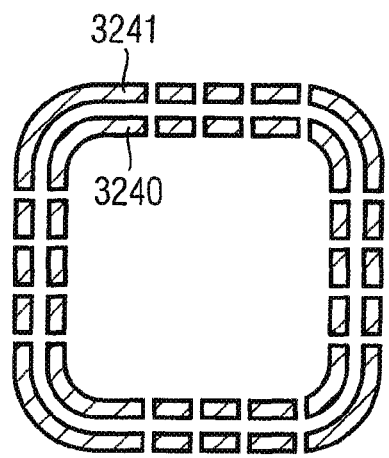

Referring to the top view of FIG. 3D, the second emitter short regions 3240, 3241 form discontinuous loops.

According to other embodiments, a number of closed or discontinuous loops surrounding the transistor cell array may be greater than one. The number of closed or discontinuous loops surrounding the transistor cell array may be chosen in consideration of a voltage blocking capability of the RC-IGBT.

Figure 4A:
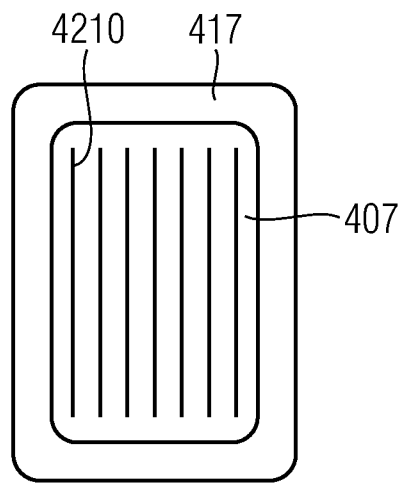
FIGS. 4A to 4F illustrate top views of different layouts of emitter short regions facing a transistor cell area of the RC-IGBT illustrated in FIG. 1A or FIG. 2.
Figure 4B:
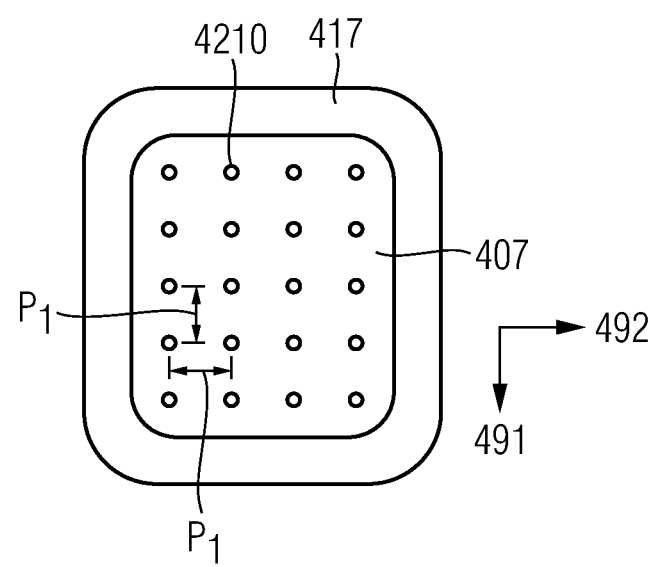
Figure 4C:
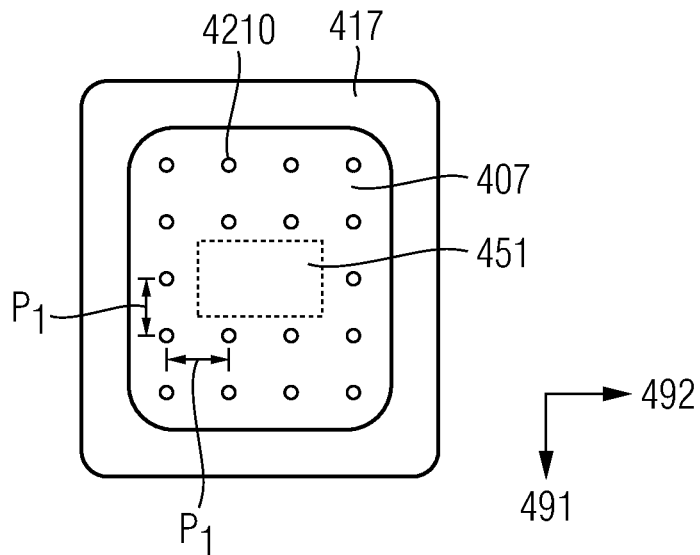

FIGS. 4A to 4C illustrate top views of different layouts of first emitter short regions 4210 facing the transistor cell area of the RC-IGBT illustrated in FIG. 1A or FIG. 2.

Referring to the top view of FIG. 4A, the first emitter short regions 4210 form parallel stripes in a first area 407 surrounded by a junction termination structure in a second area 417.

Referring to the top view of FIG. 4B, the first emitter short regions 4210 form a two dimensional array. A shape of each of the first emitter short regions 4210 may be circular, rectangular, polygonal, for example. The first emitter short regions 4210 may also include a combination of different shapes. A first interval of periodic arrangement of the plurality of distinct first emitter short regions 4210 along a first direction 491 is denoted $p_1$. A second interval of periodic arrangement of the plurality of distinct first emitter short regions 4210 along a second direction 492 equals the first interval. According to other embodiments, the first and second intervals may differ.

Referring to the top view of FIG. 4C, the first emitter short regions 4210 form a two-dimensional array similar to the layout of FIG. 4B. A periodic arrangement of the first emitter short regions 4210 is interrupted by an area 451. Depending on a size of the transistor cell array, a plurality of areas 451 may interrupt the two dimensional array of the first emitter short regions 4210 and act as rear side emitter trigger regions. A voltage drop along each of the areas 451 in a drift zone of the RC-IGBT caused by an electron current may exceed a forward bias voltage of a diode and lead to carrier injection by the rear side emitter.

The different layouts of first and second emitter short regions illustrated in FIGS. 3A to 4C can be combined in any way in consideration of the further layout measures described with respect to the embodiment illustrated in FIG. 1.

Figure 4D:
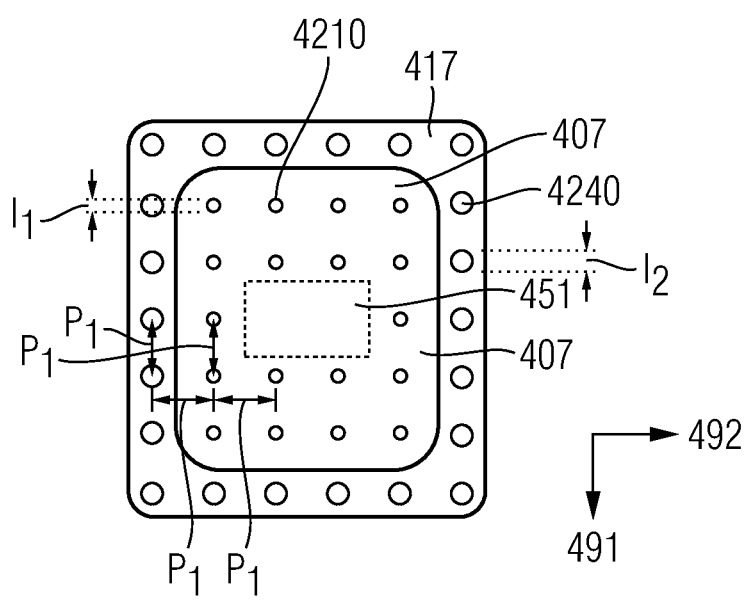
Figure 4F:
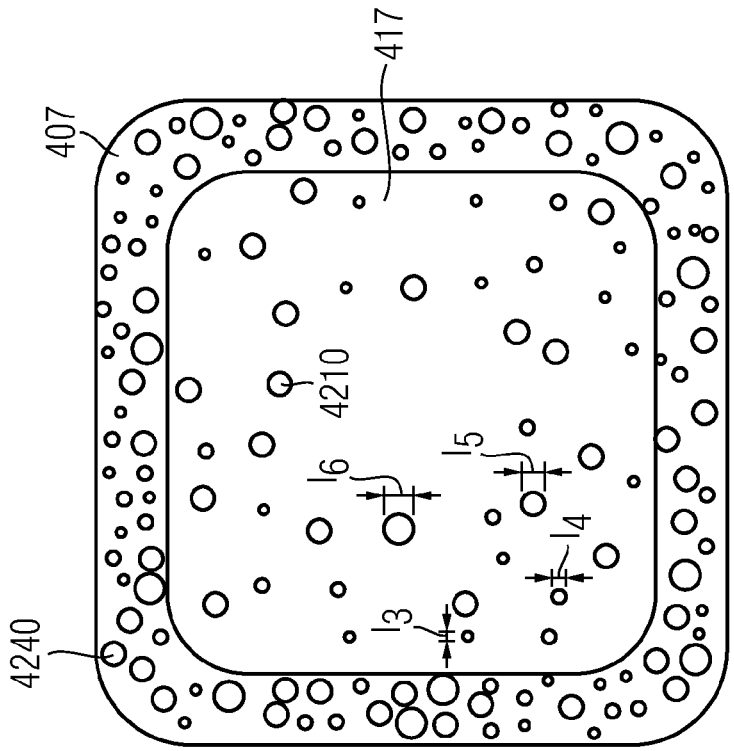
Figure 4E:
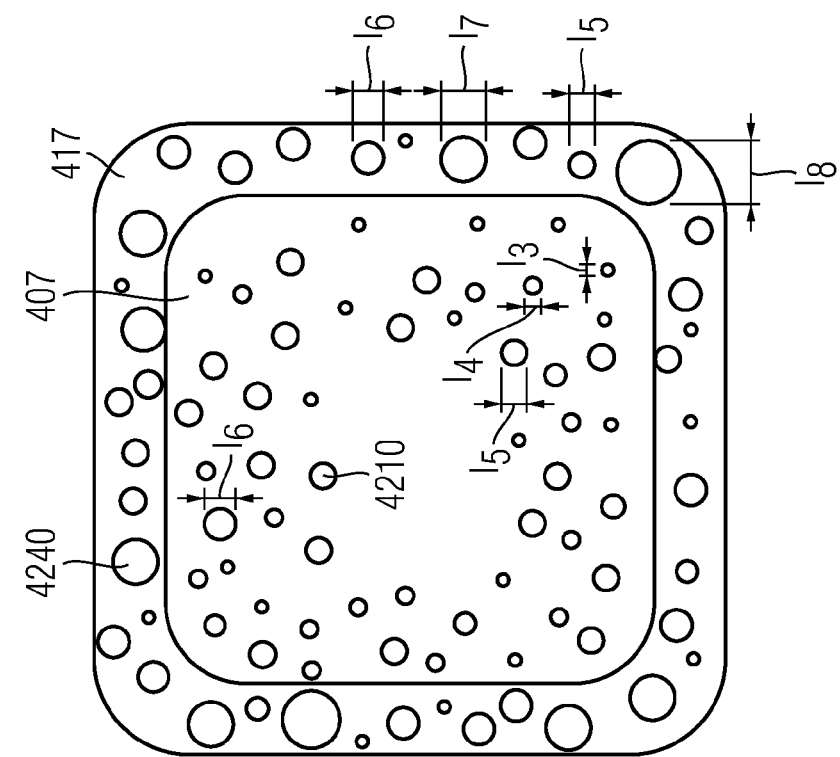

FIGS. 4D to 4F illustrate embodiments of top views of different layouts of first and second emitter short regions 4210, 4240 of the RC-IGBT illustrated in FIG. 1A or FIG. 2.

Referring to the top view of FIG. 4D, the first emitter short regions 4210 form a two-dimensional array similar to the layout of FIG. 4C. The second emitter short regions 4240 are arranged in the second area 417. An interval of periodic arrangement of the second emitter short regions 4240 in the second area 417 equals the interval $p_1$ of the first emitter short regions 4210 in the first area 407. Lateral dimensions $I_2$ of the second emitter short regions 4240 are greater than lateral dimensions $I_1$ of the first emitter short regions 4210. Thus, a first ratio between an area of the plurality of distinct first emitter short regions 4210 and the first area 407 is smaller than a second ratio of the second emitter short regions 4240 and the second area 417.

Referring to the top view of FIG. 4E, the first emitter short regions 4210 are scattered over the first area 407. Lateral dimensions of the first emitter short regions 4210 are $I_3, I_4, I_5$ and $I_6$. The second emitter short regions 4240 are scattered over the second area 417. Lateral dimensions of the second emitter short regions 4240 are $I_5, I_6, I_7$ and $I_8$. The first and second emitter short regions 4210, 4240 differ in their lateral dimensions with respect to the first emitter short regions 4210 with lateral dimensions of $I_3, I_4$ and the second emitter short regions 4240 with lateral dimensions of $I_7, I_8$. Adjusting $I_7, I_8$ greater than $I_3, I_4$ allows for setting a first ratio between an area of the plurality of distinct first emitter short regions 4210 and the first area 407 smaller than a second ratio of the second emitter short regions 4240 and the second area 417.

Referring to the top view of FIG. 4F, the first emitter short regions 4210 are scattered over the first area 407. Lateral dimensions of the first emitter short regions 4210 are $I_3, I_4, I_5$ and $I_6$. The second emitter short regions 4240 are scattered over the second area 417. Lateral dimensions of the second emitter short regions 4240 are $I_3, I_4, I_5$ and $I_6$ similar to the first emitter short regions 4210. By placing more second emitter short regions 4240 per unit area in the second area 417 than first emitter short regions 4210 per unit area in the first area 407, a first ratio between an area of the plurality of distinct first emitter short regions 4210 and the first area 407 is set smaller than a second ratio of the second emitter short regions 4240 and the second area 417.

The conductivity types specified in the exemplary embodiments described above may also be reversed in each case. Thus, it is also possible, for example, to apply a p-channel RC-IGBT instead of an n-channel RC-IGBT.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
an IGBT comprising:
a semiconductor body including a transistor cell array in a first area;
a junction termination structure in a second area surrounding the transistor cell array at a first side of the semiconductor body;
an emitter region of a first conductivity type at a second side of the semiconductor body opposite the first side; and
a diode comprising an anode and a cathode, wherein either:
the anode includes a body region and the cathode includes a plurality of distinct first emitter short regions of a second conductivity type at the second side facing the transistor cell array and at least one second emitter short region of the second conductivity type at the second side facing the junction termination structure; or
the cathode includes the body region and the anode includes the distinct first emitter short regions and the at least one second emitter short region,
wherein the at least one second emitter short region is distinct from the first emitter short regions,
wherein a first ratio between an area of the plurality of distinct first emitter short regions and the first area is smaller than a second ratio between an area of the at least one second emitter short region and the second area.

2. The semiconductor device of claim 1, wherein the plurality of distinct first emitter short regions and the at least one second emitter short region differ by at least one of lateral dimensions and interval of periodic arrangement.

3. The semiconductor device of claim 1, wherein the emitter region, the plurality of distinct first emitter short regions and the at least one second emitter short region lie in a plane.

4. The semiconductor device of claim 1, wherein the emitter region, the plurality of distinct first emitter short regions and the at least one second emitter short region are electrically connected to a common electrode at the second side.

5. The semiconductor device of claim 1, wherein a shape of the at least one second emitter short region is a closed or discontinuous loop surrounding the transistor cell array.

6. The semiconductor device of claim 5, wherein the at least one second emitter short region includes a plurality or a combination of closed and discontinuous loops surrounding the transistor cell array.

7. The semiconductor device of claim 1, wherein the at least one second emitter short region partly overlaps with the first area.

8. The semiconductor device of claim 1, wherein the first ratio ranges between 1% and 80% of the second ratio.

9. The semiconductor device of claim 1, wherein the first ratio ranges between 0.01 and 0.2.

10. The semiconductor device of claim 1, wherein the second ratio ranges between 0.02 and 1.

11. The semiconductor device of claim 1, wherein the plurality of distinct first emitter short regions are scattered over the first area.

12. The semiconductor device of claim 1, wherein each one of the plurality of first distinct emitter short regions and the at least one second emitter short region provide an electrical connection between a drift zone and an electrode at the second side.

13. The semiconductor device of claim 1, wherein the IGBT includes a body region of the first conductivity type adjoining a gate dielectric, and the junction termination structure in the second area includes at least one junction termination region of the first conductivity type electrically connected to the body region.

14. The semiconductor device of claim 13, wherein the at least one junction termination region extends deeper into the semiconductor body than the body region, and the at least one junction termination region includes a dosage of doping of the first conductivity type higher than the body region.

15. The semiconductor device of claim 13, wherein a width of the at least one junction termination region ranges between 5 µm and 120 µm.

16. The semiconductor device of claim 13, wherein a vertical doping profile of the at least one junction termination region and the body region are equal, and the at least one junction termination region and the body region are electrically connected.

17. The semiconductor device of claim 16, further comprising a source region of the second conductivity type in the transistor cell array, wherein the source region is absent in the junction termination region.

18. The semiconductor device of claim 1, wherein a threshold voltage of an outermost transistor channel region at a transition between the junction termination structure and the transistor cell array is greater than a threshold voltage of a channel region in the transistor cell array.

19. The semiconductor device of claim 1, wherein the semiconductor device is a reverse conducting IGBT including a p-doped body region and n-doped first and second emitter short regions.

20. The semiconductor device of claim 1, wherein the IGBT includes trench transistor cells.

* * * * *